United States Patent
Bendix (10) Patent No.: US 11,056,089 B2
(45) Date of Patent: Jul. 6, 2021

(54) CIRCUIT BOARD WITH DIELECTRIC SURFACE SWITCH AND EMBEDDED METAMATERIALS PROVIDING INCREASED ARC RESISTANCE

(71) Applicant: Sparton DeLeon Springs, LLC, DeLeon Springs, FL (US)

(72) Inventor: Lendon L. Bendix, Melbourne, FL (US)

(73) Assignee: Sparton DeLeon Springs, LLC, DeLeon Springs, FL (US)

( * ) Notice: Subject to any disclaimer, the term of this patent is extended or adjusted under 35 U.S.C. 154(b) by 446 days.

(21) Appl. No.: 16/136,547

(22) Filed: Sep. 20, 2018

(65) Prior Publication Data

US 2020/0098344 A1    Mar. 26, 2020

(51) Int. Cl.
| | | |
|---|---|---|
| *G10K 11/00* | (2006.01) | |
| *H05K 1/11* | (2006.01) | |
| *H05K 1/02* | (2006.01) | |

(52) U.S. Cl.
CPC ............ *G10K 11/008* (2013.01); *H05K 1/024* (2013.01); *H05K 1/115* (2013.01); *H05K 2201/0137* (2013.01)

(58) Field of Classification Search
CPC ...... G10K 11/008; H05K 1/024; H05K 1/115; H05K 2201/0137; H05K 2201/09254; H05K 2201/10037; H05K 2201/10053; H05K 1/16; H05K 3/4688; H05K 1/023; H05K 1/0242; H05K 1/0236; G01V 3/12
See application file for complete search history.

(56) References Cited

U.S. PATENT DOCUMENTS

| | | | | |
|---|---|---|---|---|
| 2010/0024210 | A1* | 2/2010 | Bendix | ............... H05K 1/0268 29/832 |
| 2015/0245548 | A1 | 8/2015 | Bendix et al. | |
| 2016/0316553 | A1 | 10/2016 | Bendix et al. | |
| 2020/0098344 | A1* | 3/2020 | Bendix | ................. H05K 1/115 |

FOREIGN PATENT DOCUMENTS

| | | | | |
|---|---|---|---|---|
| CA | 3055713 | A1 * | 3/2020 | ............... G01V 3/12 |
| EP | 3634092 | A1 * | 4/2020 | ............. H05K 1/115 |

OTHER PUBLICATIONS

International search report on international application No. EP19197596.

* cited by examiner

*Primary Examiner* — Daniel Pihulic
(74) *Attorney, Agent, or Firm* — Quinn IP Law (57) ABSTRACT

A PCBA for use in a high-energy broadband electric field includes a low-voltage power supply and alternating conductive and dielectric layers. An outermost one of the conductive layers includes a dielectric surface switch having closely-spaced switch contacts. The first switch contact is connected to the positive terminal and the second switch contact is connected to the negative terminal. Vias connect the conductive layers to the terminals through the respective first and second switch contacts to form power and ground planes. A metamaterial layer of nickel is doped with up to 20 percent phosphorus or chromium by weight, has a uniform thickness of less than 5 μm, is sandwiched between interfacing surfaces of a pair of the conductive and dielectric layers, and evenly coats one of the interfacing surfaces. A sonobuoy system includes the PCBA, e.g., an Electronic Function Select board, a cylindrical housing, and an acoustic array.

18 Claims, 4 Drawing Sheets

CIRCUIT BOARD WITH DIELECTRIC SURFACE SWITCH AND EMBEDDED METAMATERIALS PROVIDING INCREASED ARC RESISTANCE

TECHNICAL FIELD

The present disclosure relates to embedded metamaterial-based solutions for improved switch arcing performance in printed circuit board assemblies having one or more dielectric surface switches directly exposed to high-energy broadband electric fields, as well as to electronic systems employing such assemblies and operating in such an electric field.

BACKGROUND

A printed circuit board assembly (PCBA) contains essential logic and associated electronic hardware for controlling operation of an electronic system. A PCBA is typically fabricated from a stack-up of alternating conductive and dielectric printed circuit board layers, e.g., copper foil layers and glass-reinforced epoxy laminate layers, respectively. Microelectronic circuit components forming the control circuit are arranged on or within the various layers of the stack-up, with the circuit components commonly including microprocessor chips, memory chips, capacitors, inductors, transistors, diodes, resistors, and other surface-mounted or embedded components. Electrical connectors, heat sinks, and digital displays or LED readouts may be added to the stack-up to form the PCBA. The various layers and components of the PCBA are electrically interconnected to a small battery or other low-voltage power supply through external wires and internal conductive vias.

Some conductive layers or designated areas thereof are electrically connected to a negative terminal of the power supply or to another common ground node of the circuit in order to collectively form a conductive ground plane of the PCBA. A separate power plane, which is separated from an adjacent ground plane by the dielectric layer(s) and constructed from additional conductive layers, is electrically connected to the positive voltage terminal of the power supply. The ground plane distributes low-voltage power from the power supply to powered components of the PCBA. In some configurations, the electrical connections that are established between the dielectric-separated power and ground planes are selectively established using a dielectric surface switch, with electric current flowing from the power supply to the power and ground planes when the dielectric surface switch is in a closed state. To close the dielectric surface switch and thereby energize operation of the PCBA, a conductive surface of a push-button or plunger may be urged into direct contact with ground plane-connected and power plane-connected switch contacts of the dielectric surface switch.

SUMMARY

A printed circuit board assembly (PCBA) and an associated electronic system are described herein for use in a resonant high-energy broadband electric field, with the particular parameters defining such a field detailed below. The PCBA includes a low-voltage power supply, e.g., a lithium-ion battery or other high-energy energy storage device having a voltage rating of about 1.5-18 volts, and at least one dielectric surface switch. "Surface" as used herein refers to the location of the switch on an outermost conductive layer of the PCBA, such that the switch is directly exposed to and irradiated by the incident, externally-generated electric field and not otherwise shielded or protected by intervening board-level structure such as electromagnetic interference (EMI) shields or Faraday cages.

The PCBA further includes an embedded metamaterial layer that lines the ground plane of the PCBA. The term "metamaterial" refers in the art to engineered nanoscale materials. In the present application, such materials are constructed of nickel doped with a calibrated frequency-dependent concentration of phosphorus, chromium, or another application-suitable material. The doping concentration is tuned, e.g., in the design stages of PCBA fabrication, to interact in a predetermined manner with electric and magnetic components of the incident field to which the PCBA will be exposed. Tuning of the doping concentration (pre-selection of a specific doping percentage by weight) is intended to increase capacitance within the PCBA and, as a result, to increase arc resistance relative to a baseline arc resistance value, i.e., the level of arc resistance present in the PCBA in the absence of the metamaterial layer. A desirable effect of the metamaterial's frequency-specific behavior is that of reducing or eliminating instances of premature arcing between closely-spaced contacts of the dielectric surface switch.

With respect to preventing arcing, the metamaterial layer, which is embedded into the PCBA adjacent to a ground plane-connected conductive layer of the PCBA, has a distribution, material composition, and relative position within a stack-up of the PCBA that is collectively tailored to increase arc resistance relative to the above-noted baseline value. The particular switch arcing problem addressed by the present disclosure becomes more pronounced when the PCBA is exposed to resonant high-frequency/high-energy electric fields having a complex composition, i.e., multiple high-frequency waveforms simultaneously irradiating the PCBA. A non-limiting example embodiment of such a PCBA is an Electronic Function Select (EFS) board of an acoustic sonobuoy system, with such an EFS board described below as a representative application of the present teachings.

The types of electromagnetic fields contemplated by the present disclosure have electric field components of high-strength or intensity, and thus high energy. As used herein, "high-strength" of a resonant (i.e., non-static) field refers to electric field strengths in excess of about 200 volts per meter (V/m), with electric fields of up to 5 kV/m or more possibly falling within the scope of the disclosure. The term "resonant broadband" encompasses resonant frequencies above 10 MHz and up to about 22 GHz, although modifications may be made to extend this range below or above such range limits. In general, "high-frequency" solutions as described herein pertain to incident complex radio frequency (RF) waveforms in the high-frequency (HF) range of about 3-30 MHz, the very-high frequency (VHF) range of about 30-300 MHz, the ultra-high frequency (UHF) range of about 300 MHz-3 GHz, and the super-high frequency (SHF) range of about 3 GHz-30 GHz, as such nominal RF spectrum ranges are generally defined by the International Telecommunication Union (ITU).

Multiple waveforms within the above-noted RF frequency spectrum may fall incident upon the PCBA at a given instant in time, with the resultant effect being, from the perspective of the PCBA, a Taylor series of superimposed RF waveforms, most or all of which may be sinusoidal or periodic in form and thus possessing well-defined amplitude peaks and nulls. As noted above and described in greater detail below with reference to the drawings, the high-energy/ high-frequency resonant characteristics of such electric fields can lead to undesirable switching behavior of the dielectric surface switches of the present disclosure or other switches having similar separation between power and ground plane switch contacts. The metamaterial-based solution disclosed herein is thus ultimately intended to increase circuit capacitance at higher incident broadband frequencies, and to thereby safely steer energy accumulating in a dielectric layer back into the power supply.

In a disclosed example embodiment, a PCBA for use in a high-energy broadband electric field having a predefined complex frequency range includes a low-voltage power supply and a printed circuit board stack-up of alternating conductive and dielectric layers. An outermost one of the conductive layers (with respect to the direction of the incident broadband electric field) includes at least one dielectric surface switch having first and second switch contacts. The contacts are closely separated from each other by a dielectric gap of less than about 150 mm.

The first and second switch contacts are respectively connected to the positive and negative terminals of the low-voltage power supply. Conductive vias connect the conductive material layers to a corresponding one of the positive or negative terminals of the power supply, doing so through the respective first and second switch contacts. This in turn forms a power plane and a ground plane of the PCBA. Bridging the switch contacts connects the power supply to the various powered loads of the PCBA, while separation of the switch contacts from each other has the opposite effect of turning the PCBA off and discontinuing current flow.

As part of the disclosed PCBA in this particular embodiment, a metamaterial layer is constructed of nickel doped with up to 20 percent phosphorus or chromium by weight. In other embodiments, the doping concentration is less than about 5 percent phosphorus or chromium by weight. The metamaterial layer, which has a uniform thickness of less than 5 µm in this embodiment, and as thin as 0.1 to 1 µm in other embodiments, is sandwiched between interfacing surfaces of a designated pair of the conductive and dielectric layers. The metamaterial layer evenly coats a major surface one of the interfacing surfaces, with the predetermined doping concentration increasing the arc resistance of the PCBA or the dielectric surface switch and thereby limiting the frequency and/or number of occurrences of electrical arcing across the switch contacts when the PCBA is irradiated by the high-energy electric field.

A sonobuoy system includes a cylindrical tube, an acoustic sensor array, and the PCBA noted above.

The above features and advantages and other features and advantages of the present disclosure are readily apparent from the following detailed description of the best modes for carrying out the disclosure when taken in connection with the accompanying drawings.

The present disclosure is amenable to various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure as encompassed by the appended claims.

DETAILED DESCRIPTION

This disclosure is susceptible of embodiment in many different forms. Representative embodiments of the disclosure are shown in the drawings and will herein be described in detail with the understanding that these examples are provided as a representation of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "approximately," and the like, may be used herein in the sense of "at, near, or nearly at," or "within 0-5% of," or "within acceptable manufacturing tolerances," or any logical combination thereof, for example.

Figure 1:
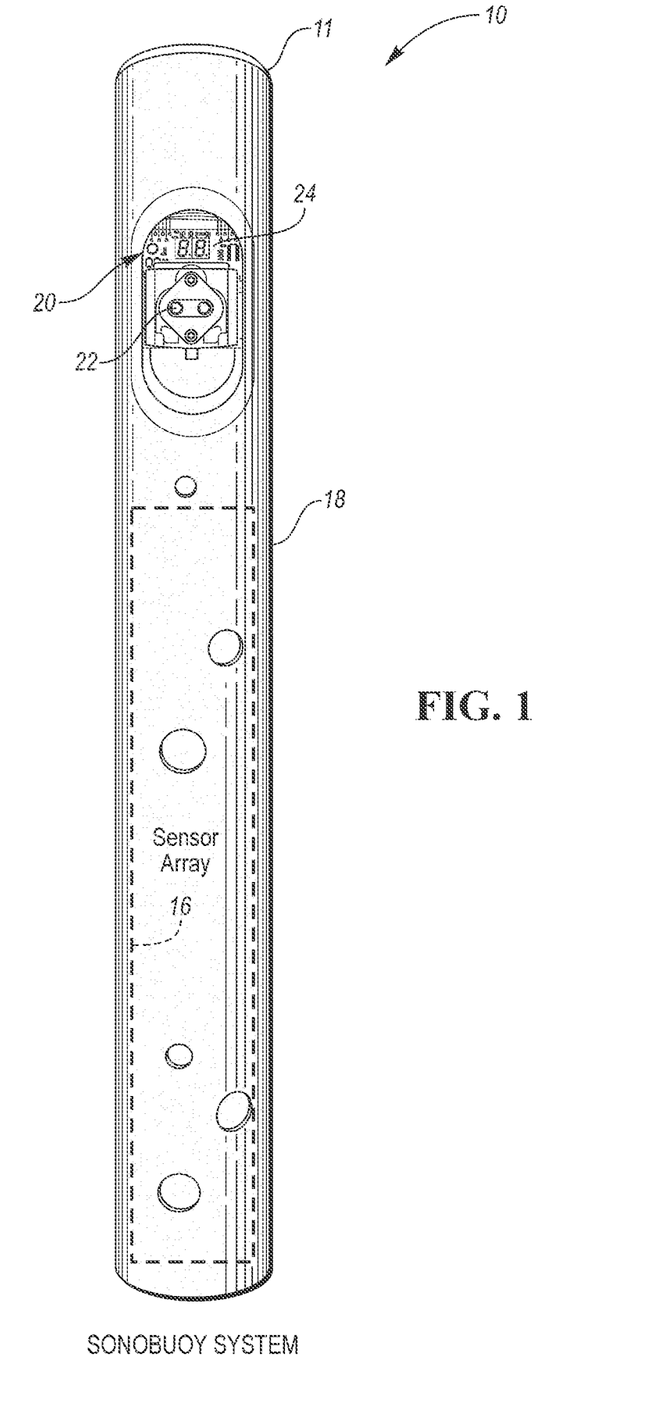
FIG. 1 is a schematic perspective view illustration of an example sonobuoy system having a PCBA constructed as set forth herein.
Figures 2, 3:
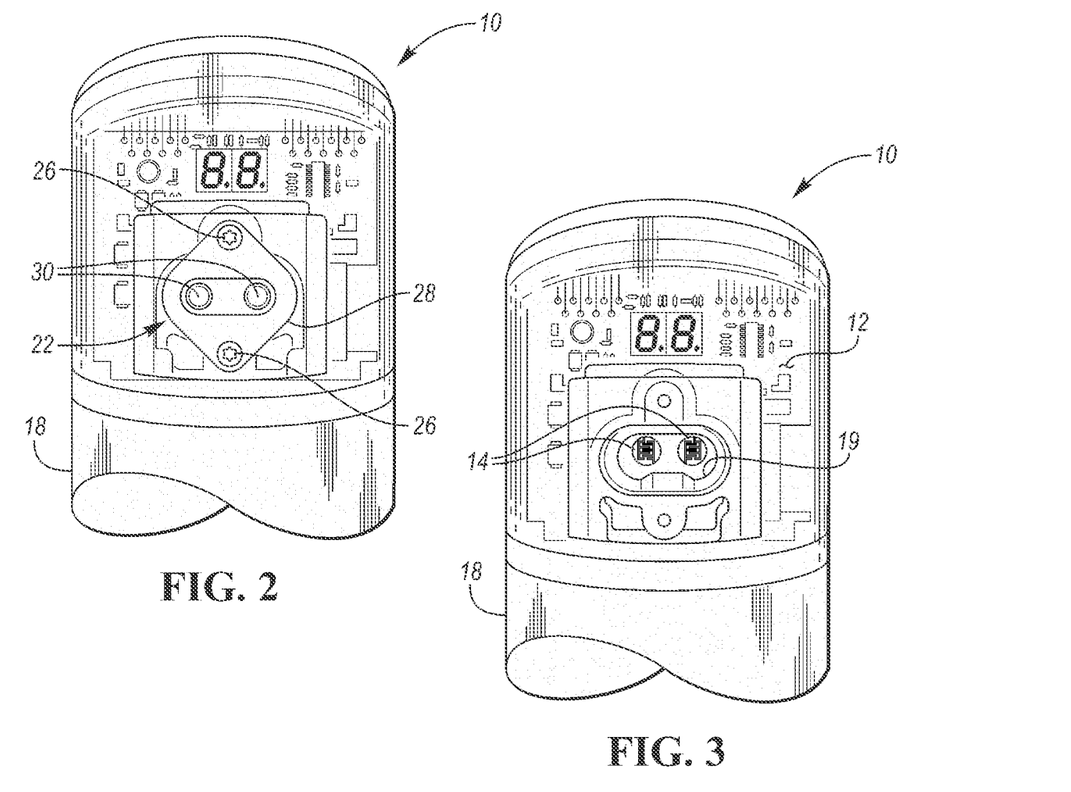
FIGS. 2 and 3 are schematic perspective view illustrations of a portion of the sonobuoy shown in FIG. 1, with FIG. 2 depicting a push-button assembly in an installed position and FIG. 3 depicting an exposed portion of a PCBA with the push-button assembly removed.

Referring to the drawings, wherein like reference numbers correspond to like or similar components throughout the several figures, and wherein the depicted components are not to scale unless so indicated, an example electronic system is shown in FIG. 1 as a representative sonobuoy system 10, additional details of which are depicted in FIGS. 2 and 3. The sonobuoy system 10 houses a printed circuit board assembly (PCBA) 12 constructed as set forth herein, with the PCBA 12 including one or more dielectric surface switches 14 (see FIG. 3) of the type described below with reference to FIGS. 3, 3A, and 5. Mitigation of the problem of electric field-induced arcing across closely-separated switch contacts in the dielectric surface switches 14 is an object of the present disclosure, with an embedded metamaterial-based solution to this potential problem disclosed below with additional reference to FIGS. 4-7.

As will be appreciated by one of ordinary skill in the art, a sonobuoy is an acoustic sensing device used to detect acoustic emissions or reflections in a body of water, and to transmit the detected acoustic signals to a remote source for processing. A sonobuoy may be used to listen for sounds directly (passive detection) or by bouncing sonar pulses off of a submerged object (active detection). As such, the sonobuoy system 10 of FIG. 1 employs a deployable sensor array 16 that detects, classifies, and localizes sources of acoustic emissions in the body of water. The range of possible electronic systems that may benefit from the disclosed approach is not limited to acoustic sensing devices in general or to sonobuoy systems in particular, but rather extends to systems incorporating a PCBA constructed according to the disclosure and used within a high-energy resonant broadband electric field. For illustrative consistency, the sonobuoy system 10 of FIG. 1 will be described hereinafter without limiting applications to such an embodiment.

The sonobuoy system 10 of FIG. 1 includes a cylindrical housing 18 sealed at both ends, e.g., via an endcap 11, and forming a launch container that contains the deployable sensor array 16 and associated deployment and control components. Although omitted from the drawings for illustrative simplicity and clarity, such additional sonobuoy components may include an inflatable floatation device and inflation gas, electrical cables, and actuators necessary for deploying the acoustic array and its associated surface-based signal receipt and transmission equipment. The PCBA 12 is likewise housed in the cylindrical housing 18, with portions of the PCBA 12 possibly being visible through a control window 20 and accessible to a user of the sonobuoy system 10 via a push-button assembly 22 and a digital display 24. The control window 20 thus provides access for selecting operating modes or operating functions of the sonobuoy system 10.

Prior to use, the sonobuoy system 10 of FIG. 1 may be stored for extended periods of time, possibly for several years, with storage often occurring in operating environments saturated with high-energy electromagnetic or radio frequency (RF) field radiation. Such radiation may by emitted, by way of example, from high-power airborne or shipborne search radar or sonar systems, as well as from high-frequency communications equipment and other systems. The frequencies, wavelengths, and amplitudes of the incident broadband electric fields considered herein are highly source-dependent, with multiple sources being simultaneously active in a given area of operation. Thus, RF field energy falls incident on the sonobuoy system 10, and thus the PCBA 12, in a complex and additive manner, manifesting as a Taylor series of superimposed signals. The nonlinear frequency response within the PCBA 12 can have various undesirable consequences, with switch arcing being a particular problem addressed by the present disclosure.

As will be described below, the PCBA 12 includes or is connected to a low-voltage power supply 25 (FIG. 6) as its source of power, with "low-voltage" generally referring to voltage levels of 18 volts direct current (VDC) down to voltage levels as low as 1.5 VDC. Due to interplay between the incident broadband electric fields and a uniform steady-state electric field established by the low-voltage power supply 25, arc resistance is reduced within the dielectric surface switch 14 of FIG. 3. As the incident RF waveforms increases in frequency well above 10 MHz, the dielectric surface switch 14 will eventually experience arcing, and the PCBA 12 will be intermittently turned on and off as a result. In turn, transient power draw on the low-voltage power supply 25 of FIG. 6 may reduce the operating life of the sonobuoy system 10 or cause other undesirable performance effects.

As shown in FIG. 2, the sonobuoy system 10 includes the push-button assembly 22, which is mounted to the cylindrical housing 18 via fasteners 26. The push-button assembly 22 includes a plate 28 through which is disposed a plurality of push-buttons 30. The push-buttons 30 include a facing surface 32, e.g., a rubber, polymer, or plastic material, and a conductive surface 34 (see FIG. 6) located diametrically opposite to the facing surface 32. The PCBA 12 and its display screen/control window 20 are visible from the perspective of FIG. 2. User interaction with the PCBA 12 may be achieved via movement of the push-buttons 30, which in turn moves the conductive surface 34 toward the switch contacts. The user thus activates the PCBA 12 and/or selects a desired mode or other function by pressing one or both of the push-buttons 30 of FIG. 6, thus moving in the general direction of arrows A, to thereby close an electric circuit with the low-voltage power supply 25 of FIG. 6.

FIG. 3 shows a portion of the cylindrical housing 18 with push-button assembly 22 of FIG. 2 removed, such that a portion of the PCBA 22 in proximity to the dielectric surface switches 14 is exposed through an opening perimeter 19. Visible from the perspective of FIG. 3 are a pair of the above-noted dielectric surface switches 14, with another view of the dielectric surface switches 14 depicted in FIG. 5. In the illustrated configuration, two such dielectric surface switches 14 are used, side-by-side, with one dielectric surface switch 14 for each corresponding one of the push-buttons 30 shown in FIG. 2. The dielectric surface switches 14 may be used in different electric circuits within the PCBA 12, and thus may be used to initiate different control modes. For instance, depression of one push-button 30 may close the corresponding dielectric surface switch 14 and thereby cause the dielectric surface switch 14 to turn on, e.g., to initiate operation of the sonobuoy system 10, while depression of the other push-button switch 14 may allow selection of a particular operating mode, starting of a timer, or performance any number of possible control functions.

Figure 3A:
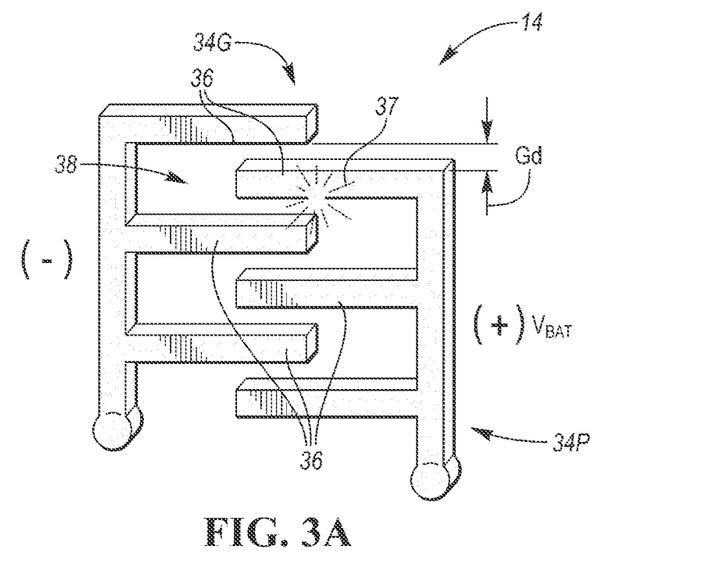
FIG. 3A is a schematic perspective view illustration of an example surface switch having closely-spaced interleaved conductive fingers, with the surface switch usable as part of the PCBA described herein.

FIG. 3A schematically depicts the dielectric surface switch 14 as respective first and second sets 34G and 34P of interleaved fingers 36, e.g., copper or gold foil, with the first set 34G of interleaved fingers 36 being connected to the ground plane of the PCBA 12 and the second set 34P of interleaved fingers 36 being connected to the power plane of the PCBA 12. Close spacing between adjacent fingers 36 exists in the form of a dielectric gap ($G_d$), with the fingers 36 of the first set 34G being negative (−) switch contacts in the illustrated embodiment and the fingers 36 of the second set 34P being positive (+) switch contacts. Thus, the second set 34P has a potential equal to that of the low-voltage power supply 25, i.e., $V_{BAT}$.

Figure 6:
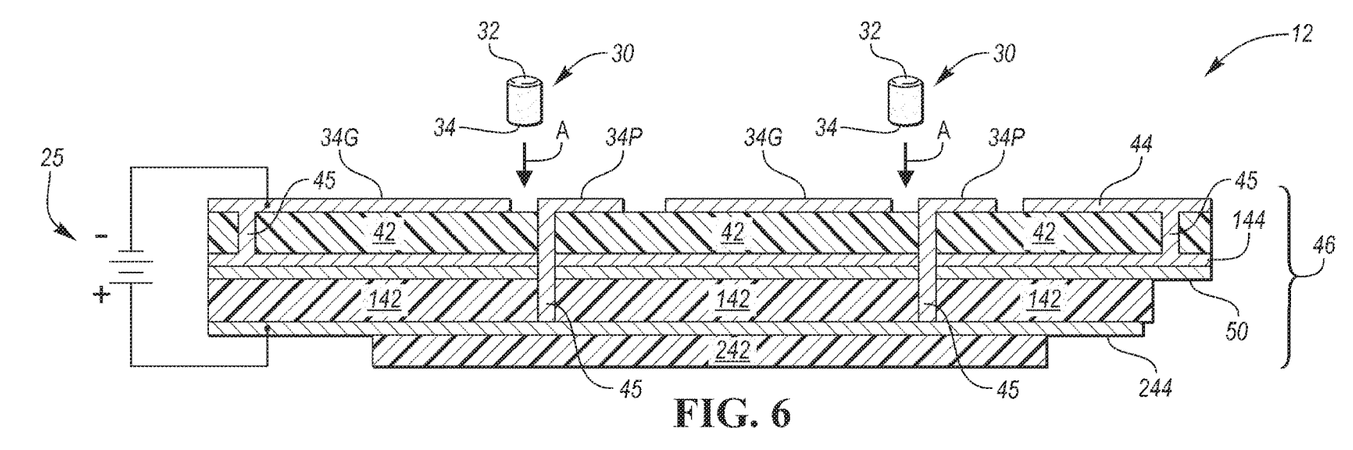
FIGS. 6 and 7 are schematic sectional and perspective view illustrations of the PCBA of FIGS. 3, 3A, and 4.

Additionally, the power plane of the PCBA 12 is connected to the low-voltage power supply 25 of FIG. 6, with the power plane in this instance including the second set 34P of interleaved fingers 36. Close spacing and the field influence of the low-voltage power supply 25 renders this particular type of dielectric surface switch 14 highly susceptible to reduced arc resistance, which is especially problematic in the types of high-energy resonant broadband electric fields contemplated by the present disclosure, i.e., about 200 to 5000 V/m at frequencies of about 10 MHz to 22 GHz, i.e., the electric field has a frequency range with an uppermost frequency of less than about 22 GHz. As used herein, "close spacing" and "closely spaced" describe relative spacing of about 3 mm to 150 mm between adjacent conductive contacts of the dielectric surface switch 14, or in this case the first and second sets 34G and 24P of interleaved fingers 36.

The close spacing of gap dimension ($G_d$) of the switch contacts in FIG. 3A is conducive to arcing. In terms of relevant physics, an electric current traveling over a surface of a dielectric material under the influence of a strong electric field will tend to damage the surface and thereby cause the surface to become more conductive over time. Arc resistance is a measure of time over which a dielectric surface will become conductive under the influence of a high-voltage/low-current arc. As an example, an arc resistance of 30 seconds (s) at 4 kV/m means that under a resonant broadband electric field of 4 kV/m, it will take approximately 30 s for a charge to build up to a level sufficient for an arcing event to occur between adjacent switch contacts. Immediately after completion of the arcing event, the potential difference between adjacent switch contacts is normalized. The process of charge accumulation then repeats, and thus multiple arc events may be observed over an extended period of time.

In general, electrical arcing is the phenomenon associated with an electrical current traveling across an air gap between spaced conductors having a charged surface. In FIG. 3A, for instance, the gap defined by gap dimension $G_d$ is filled with dielectric material such as glass-reinforced epoxy laminate, e.g., FR4. A measure of capacitance encountered by a given electric field depends on the medium subjected to the field. FR4, for instance, has a relative permittivity of about 4.4, with the nominal relative permittivity of air being 1. As the frequency of the incident broadband electric field increases well above 10 MHz, however, dielectric breakdown occurs in the dielectric material, which eventually causes the dielectric material 38 located between the fingers 36 of FIG. 3A to behave more like air. An arc 37 may therefore result under conditions when a sufficient potential difference exists between the contact surfaces, in this case the first and second sets 34G and 24P of interleaved fingers 36.

Figure 4:
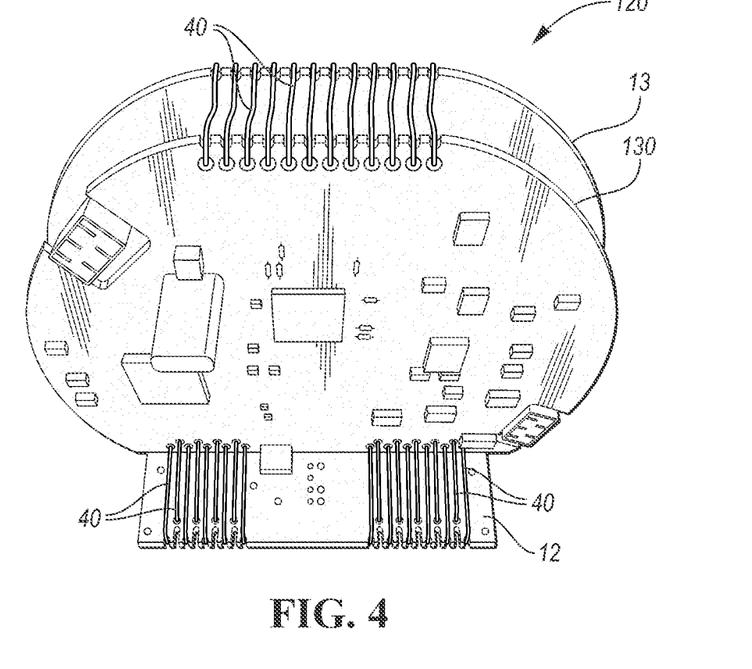
FIG. 4 is a schematic perspective view illustration of an underside of an example PCBA constructed as set forth herein.
Figure 5:
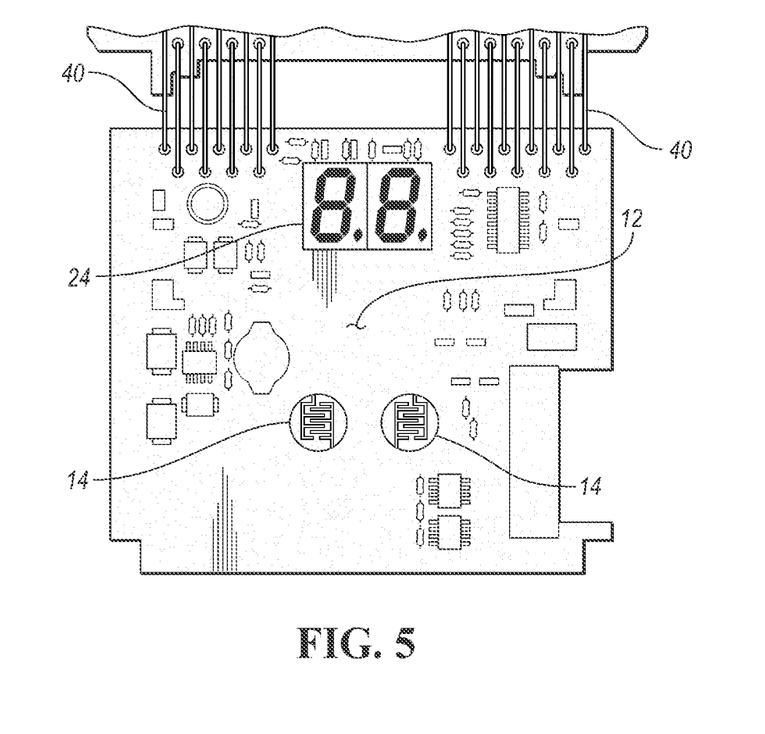
FIG. 5 is a schematic plan view illustration of an electronic function select (EFS) board usable as part of the PCBA shown in FIGS. 3, 3A, and 4.

FIG. 4 is an example illustration of a control unit 120 that includes the PCBA 12, which in turn is electrically connected by wires 40 to multiple other PCBAs 13 and 130. The control unit 120 may be placed inside a cavity of the cylindrical housing 18 of FIG. 1, which then becomes an anisotropic cavity, i.e., exhibiting properties having different values when measured in different directions. A complex frequency response to the incident broad band electric fields thus results within the cylindrical housing 18.

Each of the wires 40 shown in FIG. 4 will tend to act as an RF antenna by picking up energy from the incident broadband electric field, and will transfer such energy to its conductive traces, the power plane, and the ground plane. As current is impressed in the PCBA 12, current density variations will tend to establish local electric fields composed of both uniform/static and non-uniform/resonant electric field distributions. As the frequency of an electromagnetic pulse is increased, the period of the pulse is likewise increased. The established uniform fields may not have time to dissipate.

It is axiomatic in RF design that sharp edges and corners are to be avoided wherever possible. A high-voltage field applied across the PCBA 12 of FIG. 4, for instance, can cause high variability in the electric field. Sharp angles on components and conductive traces of the PCBA 12, including the fingers 36 of the dielectric switch 14, create locations of relatively low arc resistance, with arcing ordinarily occurring on pointed or sharp ends. Additionally, ball grid array solder balls typically used to fabricate a circuit board like the PCBA 12 are susceptible to arcing when exposed to high energy electric fields. Dielectric materials such as FR4 have a very high dielectric breakdown voltage, but can also be porous, with porosity potentially leading to problematic arcing. Cracks along edges of FR4 act as static discharge locations. Points of surface roughness are additional potential arcing points. Electron migration may occur as another possible source of arcing, particularly over extended periods of exposure to the low-voltage power supply 25 of FIG. 6. When this phenomenon occurs, sharp edges are created in contact surfaces of the dielectric surface switches 14, with the sharp edges ultimately decreasing arc resistance.

Referring to FIG. 6, the PCBA 12 includes multiple layers 46, including an upper conductive layer 44 within which is disposed the surface dielectric switches 14 described above and shown in FIGS. 3, 3A, and 5. The respective first and second sets 34G and 34P of fingers 36 (see FIG. 3A) are shown for simplicity in upper conductive layer 44. For instance, respective the first and second sets 34G and 34P of fingers 36 may be printed on a first dielectric layer 42 as two independent switch contacts. The copper ground plane is printed around dielectric surface switches 14, leaving a layer of exposed dielectric material around the switch contacts or fingers 36 as best shown in FIG. 3A. As noted above, one set of contacts, here the second set 34P of fingers 36, is connected to the positive (+) terminal of the low-voltage power supply 25 while the other set of fingers 36, i.e., the first set 34G in this example, is connected to ground, e.g., the negative (−) terminal. The push-buttons 30 are depicted in an off position. The upper conductive layer 44 is immediately adjacent to a first dielectric layer 42, e.g., FR4 or another application-suitable dielectric material.

Embedded within the PCBA 12 are a conductive ground plane layer 144, a second dielectric layer 142, and a conductive power plane layer 244. A third dielectric layer 242 may also be used as part of the PCBA 12. Thus, viewing the PCBA 12 in a downward direction from the perspective of FIGS. 2 and 3, the stack-up of the PCBA 12 sequentially passes through the outer conductive layer 44, the first dielectric layer 42, the ground plane layer 144, the metamaterial layer 50, the second dielectric layer 142, the power plane layer 244, and the third dielectric layer 242.

The positive (+) terminal of the low-voltage power supply 25 is electrically connected to the outer conductive layer 44, and thus the second set 34P of interleaved fingers 36 shown in FIG. 3A, and to the power plane layer 142. Conductive vias 45 passing through the PCBA 12 electrically connect the second set 34G of interleaved fingers 26 (FIG. 3A) to the embedded ground plane layer 144, such that at the surface of the PCBA 12, the second set 34G of interleaved fingers 36 is at the same potential as the embedded ground plane layer 144.

Figure 7:
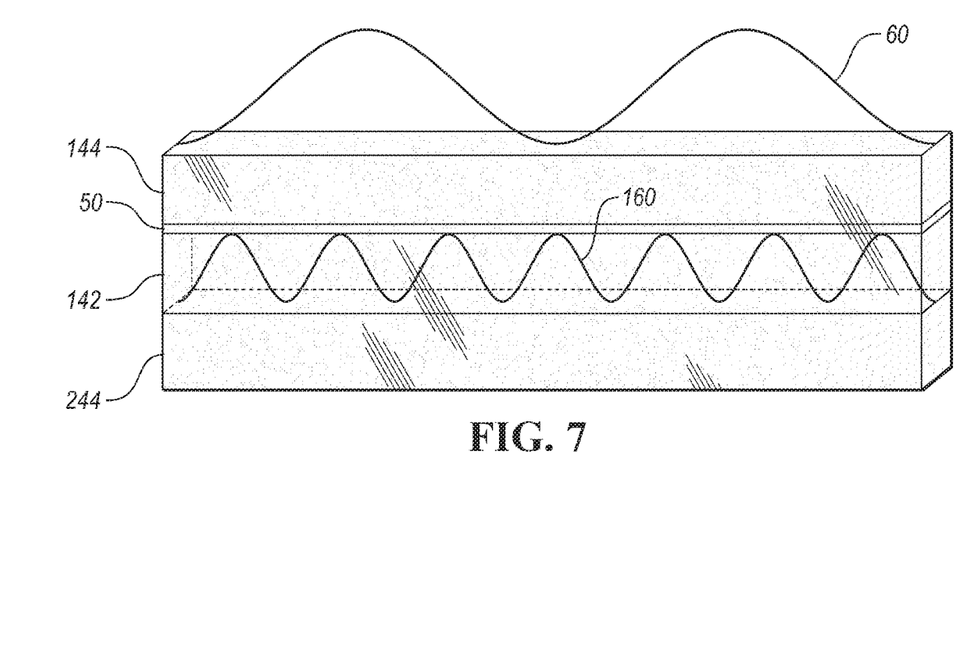

As used herein, the metamaterial layer 50 may be embodied as nickel phosphorus (NiP), a highly resistive material that exhibits a measurable frequency response when exposed to an incident broadband electric field. Other material alternatives may exist, e.g., nickel-chromium, and thus NiP is just one possible advantageous embodiment of metamaterial layer 50. As shown in FIG. 7, the metamaterial layer 50 evenly coats the entire underside of the embedded ground plane layer 144 to a calibrated thickness. For example, the metamaterial layer 50 may be rolled onto the embedded ground plane layer 144. Such even distribution is further depicted in FIG. 8 in which an example copper (Cu) layer, e.g., the ground plane layer 144, is evenly coated with metamaterial layer 50, i.e., a length (L) and width (W) of the ground plane layer 144 is the same as that of the metamaterial layer 50. While the ground plane layer 144 is shown separate from the metamaterial layer 50 for illustrative clarity, as noted above the two layers 144 and 50 have no separation between them, but instead are laminated together.

Figure 8:
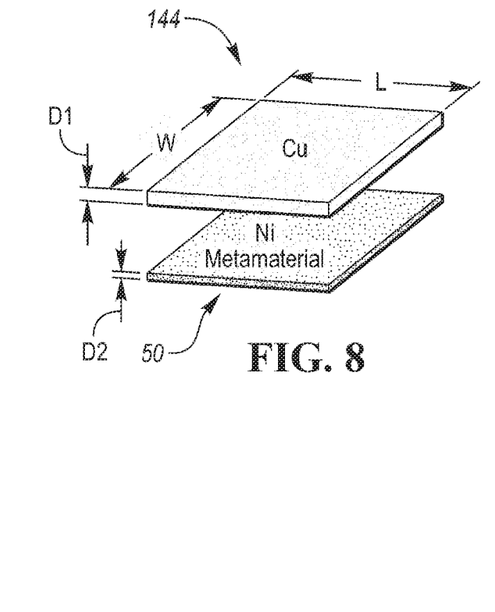
FIG. 8 is a schematic exploded view illustration of an example conductive layer and an example metamaterial layer depicting an even distribution of metamaterial on the conductive layer.

A depth (D1) of the example ground plane layer 144 exceeds a depth (D2) of the metamaterial layer 50 in the illustrated embodiment, with the surface roughness of the metamaterial layer 50 (illustrated as surface texture) varying with the incident electric field. Thus, the metamaterial layer 50 is placed evenly over the extent of the ground plan layer 144, with even thickness or depth (D2) across the area of the ground plane layer 144 as shown. While a rectangular shape is shown in FIGS. 7 and 8 for illustrative consistency, other shapes may be envisioned, e.g., circular, and thus the PCBA 12 is not necessarily rectangular in its construction.

The nickel of the metamaterial layer 50 may be doped with a predetermined, field-specific phosphorus or chromium doping percentage. For instance, the nickel material of the metamaterial layer 50 may be in the range of 3% to 20% phosphorus or chromium as the metalloid, with doping levels of about 3-5% being suitable in another embodiment, and with the thickness of the metamaterial layer 50 being less than about 5 µm, e.g., 1-3 µm or less in a particular embodiment. In other embodiments, the metamaterial layer 50 may be arranged on the power plane, with the metamaterial layer 50 in either case being arranged on a plane facing the incoming or incident external electric field.

Operation of Metamaterial Layer in a Resonant Broadband Electric Field

Referring to FIG. 7, an incident electric field, exemplified as a sinusoidal waveform 60, creates a plane wave waveform with a continuous frequency. That is, voltage between the first and second sets 34P and 34G of the interleaved fingers 36 of FIG. 3A is normally 0-volts, as the same field falls incident on both sets of interleaved fingers 36. However, the power supply 25 of FIG. 6 sets up a steady-state potential on the first set 34P of interleaved fingers 36. The second set 34G of interleaved fingers 36 is connected to the ground plane at a reference voltage (nominally 0-volts). When the electric field exemplified by waveform 60 falls incident upon the ground plane of the PCBA 12, with the ground plane 144 shown in FIG. 7, the high-energy sinusoidal waveform 60 excites the ground state of the PCBA 12 to a higher or lower reference level depending on the phase of the incident waveform 60.

That is, during phase (non-zero) portions of the waveform 60, the dielectric layer 142 will act as a capacitor and store RF energy that cannot be quickly dissipated. The potential difference between the positive (+) terminal of the power supply 25 of FIG. 6 and ground is increased, which in turn decreases arc resistance. The metamaterial layer 50 of FIGS. 6 and 7 is thus composed and positioned to control the static electric field, indicated by waveform 160 in FIG. 7, without controlling or steering field-impressed currents. Absent application of the metamaterial layer 50, the magnitude of the peaks of waveform 160 within the dielectric layer 142 will increase over time due to the magnitude and frequency (i.e., energy) of the incident electric field exemplified by sinusoidal waveform 60. This in turn would increase stored energy within the dielectric layer 142, which result is avoided by use of the metamaterial layer 50 according to the present teachings.

The metamaterial layer 50 may be rolled to an even thickness, for instance 0.1 µm to 1 µm, onto a foil of copper and then laminated onto dielectric material such as FR4. Etching of the copper and the metamaterial layer 50 may be used to achieve a desired shape, whether rectangular as shown in FIGS. 7 and 8, round, or another desired shape. A desired frequency response may be designed into the PCBA 12. In the disclosed non-limiting example NiP combination, for instance, nickel is the transition metal and phosphorus is the metalloid component. The phase transition occurring under the influence of the electric field is a ferroelectric response, which changes polarization of the nickel atoms. In the present application, the metamaterial layer 50 is used to maintain a uniform electric field in the PCBA 12 in the presence of an external resonant broadband electric field. Thus, the metamaterial layer 50 overcomes the paraelectric property of the dielectric material used in the construction of the PCBA 12.

With respect to general principles governing operation of the metamaterial layer 50 embedded in the PCBA 12 of FIGS. 6 and 7, one of ordinary skill in the art will appreciate that polarization of an electric field establishes an orthogonal magnetic field. In all cases, particles and masses will shift relative to the electric field. When this happens, the rate of change leads to an electric field frequency. From a qualitative perspective, as frequency of the incident field increases, it becomes increasingly difficult for a mechanical system to follow the rate of change.

The principle of operation of the metamaterial layer 50 is further explained as follows. The low-voltage power supply 25 of FIG. 6 provides the electric potential for establishing a uniform steady-state electric field in the PCBA 12. When such a field falls incident on the embedded copper planes, e.g., the ground plane 144 of FIG. 6, an impressed current from the magnetic component of the incident field passes around the outer surface ("skin") of the copper forming the ground plane 144, as will be appreciated by those of ordinary skill in the art. That is, the ground plane 144 develops a magnetic field that cannot be shielded or stopped by surrounding materials, unlike an electric field. The magnetic current is driven to ground via the power supply 25 along the interface between the ground plane 144 and the metamaterial layer 50. As a result, a surface field wave 160 is created with peaks and nulls as shown in FIG. 7.

The dielectric material layer 142 acts as a capacitor in FIG. 7 by storing energy from the surface field wave 160, a problem that is exacerbated by increasing frequency, and that is particularly problematic at incident frequencies well in excess of 100 MHz. As frequency increases, the dielectric constant will trend towards that of free space, and as a result, capacitance will decrease within the dielectric material layer 142.

However, surface roughness of the metamaterial layer 50 located adjacent to the dielectric material layer 142 increases with increasing frequency. That is, higher frequencies of the incident field, i.e., waveform 60 of FIG. 7, correspond to greater distances of separation between nickel atoms. This increased separation and resultant surface roughness in turn creates additional capacitance at the interface of the metamaterial layer 50 and the ground plane or conductive layer 144 to offset the frequency-driven decrease in capacitance of the dielectric layer 142. Effectively, then, the present approach maintains and controls the equivalent capacitance between the ground and power planes of the PCBA 12 using frequency-specific properties of the metamaterial layer 50, doing so, unlike an RF absorber, without absorbing and re-radiating absorbed energy as heat, and doing so, unlike a Faraday cage or EMI shield, without blocking an incident electric field from reaching into the PCBA 12.

The present approach thus enables energy from a surface wave (waveform 160 of FIG. 7) to flow safely back into the power supply 25 of FIG. 6 along the interface between the metamaterial layer 50 and the conductive layer 144, rather than allowing such energy to steadily build in the dielectric layer 142. In other words, the metamaterial layer 50 serves as a brake on the rate at which energy from the standing wave (waveform 160) within the PCBA 12 builds within the dielectric layer 142, effectively neutralizing the undesirable arcing effects induced field. If the power supply 25 is constructed from a high-energy chemistry such a lithium ion battery, then the response time is sufficient for discharging the dielectric layer and increasing arc resistance, thereby delaying onset of an arcing event in the PCBA. These and other attendant benefits will be readily appreciated by those of ordinary skill in the art in view of this disclosure.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

The invention claimed is:

1. A printed circuit board assembly (PCBA) for use in a high-energy broadband electric field, the PCBA comprising:
   a low-voltage power supply having a positive terminal and a negative terminal;
   a printed circuit board stack-up of alternating conductive layers and dielectric layers, wherein an outermost one of the conductive layers with respect to the high-energy broadband electric field includes a dielectric surface switch having closely-spaced first and second switch contacts, wherein a first switch contact of the closely-spaced first and second switch contacts is connected to the positive terminal and a second switch contact of the closely-spaced first and second switch contacts is connected to the negative terminal;
   conductive vias, each respectively connecting the conductive layers to a corresponding one of the positive terminal or the negative terminal through the respective first switch contact and the second switch contact to thereby form a power plane and a ground plane of the PCBA; and
   a metamaterial layer constructed of nickel doped with a predetermined doping concentration of up to 20 percent phosphorus or chromium by weight, having a uniform thickness of less than 5 μm, sandwiched between interfacing surfaces of a designated pair of the alternating conductive layers and dielectric layers, and evenly coating one of the interfacing surfaces, the predetermined doping concentration being configured to increase arc resistance of the dielectric surface switch relative to a baseline value and thereby limit arcing across the first switch contact and the second switch contact when the PCBA is irradiated by the high-energy broadband electric field.

2. The PCBA of claim 1, wherein the dielectric surface switch includes first and second sets of interleaved conductive fingers, and wherein the closely-spaced first and second switch contacts are the first and second sets of interleaved conductive fingers, and the first and second sets of interleaved conductive fingers are separated from each other by less than 150 mm.

3. The PCBA of claim 1, wherein the predetermined doping concentration is less than 5 percent phosphorus or chromium by weight.

4. The PCBA of claim 3, wherein the predetermined doping concentration is in 1 percent to 3 percent phosphorous or chromium by weight.

5. The PCBA of claim 1, wherein the uniform thickness is less than 1 μm.

6. The PCBA of claim 1, wherein the high-energy broadband electric field has a frequency range with an uppermost frequency of less than about 22 GHz.

7. The PCBA of claim 1, wherein the low-voltage power supply is a lithium ion battery.

8. The PCBA of claim 1, wherein the PCBA includes a circuit configured for operable as an Electronic Range Selection (ERS) board for a sonobuoy system.

9. The PCBA of claim 1, wherein the dielectric layers are constructed of FR4 material.

10. A sonobuoy system comprising:
    a cylindrical tube;
    an acoustic sensor array; and
    a printed circuit board assembly (PCBA) for use in a high-energy broadband electric field, the PCBA and the acoustic sensor array being contained within the cylindrical tube, the PCBA comprising:
      a low-voltage power supply having a positive terminal and a negative terminal;
      a printed circuit board stack-up of alternating conductive layers and dielectric layers, wherein an outermost one of the conductive layers with respect to the high-energy broadband electric field includes a dielectric surface switch having closely-spaced first and second switch contacts, wherein a first switch contact of the closely-spaced first and second switch contacts is connected to the positive terminal and a second switch contact of the closely-spaced first and second switch contacts is connected to the negative terminal;
      conductive vias, each respectively connecting the conductive layers to a corresponding one of the positive terminal or the negative terminal through the respective first switch contact and the second switch contact to thereby form a power plane and a ground plane of the PCBA; and
      a metamaterial layer constructed of nickel doped with a predetermined doping concentration of up to 20 percent phosphorus or chromium by weight, having a uniform thickness of less than 5 μm, sandwiched between interfacing surfaces of a designated pair of the alternating conductive layers and dielectric layers, and evenly coating one of the interfacing surfaces, the predetermined doping concentration being configured to increase arc resistance of the dielectric surface switch relative to a baseline and thereby limit arcing across the first and second switch contacts when the PCBA is irradiated by the high-energy broadband electric field.

11. The sonobuoy system of claim 10, wherein the dielectric surface switches include first and second sets of interleaved fingers, and wherein the closely-spaced first and second switch contacts are the first and second sets of interleaved fingers, and the first and second sets of interleaved fingers are separated from each other by less than 150 mm.

12. The sonobuoy system of claim 10, wherein the predetermined doping concentration is less than 5 percent phosphorus or chromium by weight.

13. The sonobuoy system of claim 12, wherein the predetermined doping concentration is 1 percent to 3 percent phosphorous or chromium by weight.

14. The sonobuoy system of claim 10, wherein the uniform thickness is less than 1 μm.

15. The sonobuoy system of claim 10, wherein the high-energy broadband electric field has a frequency range with an uppermost frequency of less than about 22 GHz.

16. The sonobuoy system of claim 10, wherein the low-voltage power supply is a lithium ion battery.

17. The sonobuoy system of claim 10, wherein the PCBA includes a digital display and is configured as an Electronic Range Selection (ERS) board for a sonobuoy system.

18. The sonobuoy system of claim 10, wherein the dielectric layers are constructed of FR4 material.

* * * * *